(12) United States Patent
Kimura et al.

(10) Patent No.: US 9,446,910 B2
(45) Date of Patent: Sep. 20, 2016

(54) SUBSTRATE TRANSFER ROBOT, SUBSTRATE TRANSFER SYSTEM, AND METHOD FOR TRANSFERRING SUBSTRATE

(71) Applicant: KABUSHIKI KAISHA YASKAWA DENKI, Kitakyushu-shi (JP)

(72) Inventors: Yoshiki Kimura, Kitakyushu (JP); Daisuke Shin, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 215 days.

(21) Appl. No.: 14/285,565

(22) Filed: May 22, 2014

(65) Prior Publication Data

US 2014/0350714 A1  Nov. 27, 2014

(30) Foreign Application Priority Data

May 22, 2013 (JP) .................................. 2013-108413

(51) Int. Cl.
*G06F 7/00* (2006.01)
*B65G 47/90* (2006.01)
*B25J 9/04* (2006.01)
*H01L 21/67* (2006.01)
(Continued)

(52) U.S. Cl.
CPC ............... *B65G 47/90* (2013.01); *B25J 9/042* (2013.01); *B25J 9/1679* (2013.01); *H01L 21/67265* (2013.01); *H01L 21/67766* (2013.01); *G05B 2219/40087* (2013.01); *G05B 2219/45031* (2013.01); *Y10S 901/02* (2013.01)

(58) Field of Classification Search
USPC ......................................................... 700/213
See application file for complete search history.

(56) References Cited

U.S. PATENT DOCUMENTS

2003/0108415 A1  6/2003 Hosek et al.
2005/0011294 A1* 1/2005 Hashimoto .............. B25J 9/042
                                                            74/490.01
(Continued)

FOREIGN PATENT DOCUMENTS

CN      102085658    6/2011
JP      2005-039047  2/2005
(Continued)

OTHER PUBLICATIONS

Japanese Office Action for corresponding JP Application No. 2013-108413, Apr. 21, 2015.
(Continued)

*Primary Examiner* — Kyle Logan
(74) *Attorney, Agent, or Firm* — Mori & Ward, LLP

(57) ABSTRACT

A substrate transfer robot includes a hand to approach a substrate storage on which a substrate is placed, and to hold the substrate. An arm moves the hand. A controller controls a position and orientation of the hand. When in plan view, a substrate holding center at a time when the hand is holding the substrate is adjacent to the substrate storage and is at an access start position at a predetermined distance from the substrate storage, the substrate holding center reaches a substrate placement position in the substrate storage with a hand center line inclined toward an access straight line and with the hand holding center overlapping the access straight line. The hand center line is oriented from a base to a distal end of the hand. The access straight line is perpendicular to a front surface of the substrate storage and associated with the hand approaching the substrate storage.

22 Claims, 7 Drawing Sheets

(51) Int. Cl.
*H01L 21/677* (2006.01)
*B25J 9/16* (2006.01)

(56) References Cited

U.S. PATENT DOCUMENTS

2008/0025824 A1 1/2008 Hashimoto
2011/0135437 A1 6/2011 Takeshita et al.

FOREIGN PATENT DOCUMENTS

JP 2011-228627 11/2011
KR 10-2005-0008523 1/2005

OTHER PUBLICATIONS

Korean Office Action for corresponding KR Application No. 10-2014-0060158, Sep. 17, 2015.

Chinese Office Action for corresponding CN Application No. 201410129367.3, Nov. 27, 2015.

Taiwanese Office Action for corresponding TW Application No. 103105274, May 5, 2016.

* cited by examiner

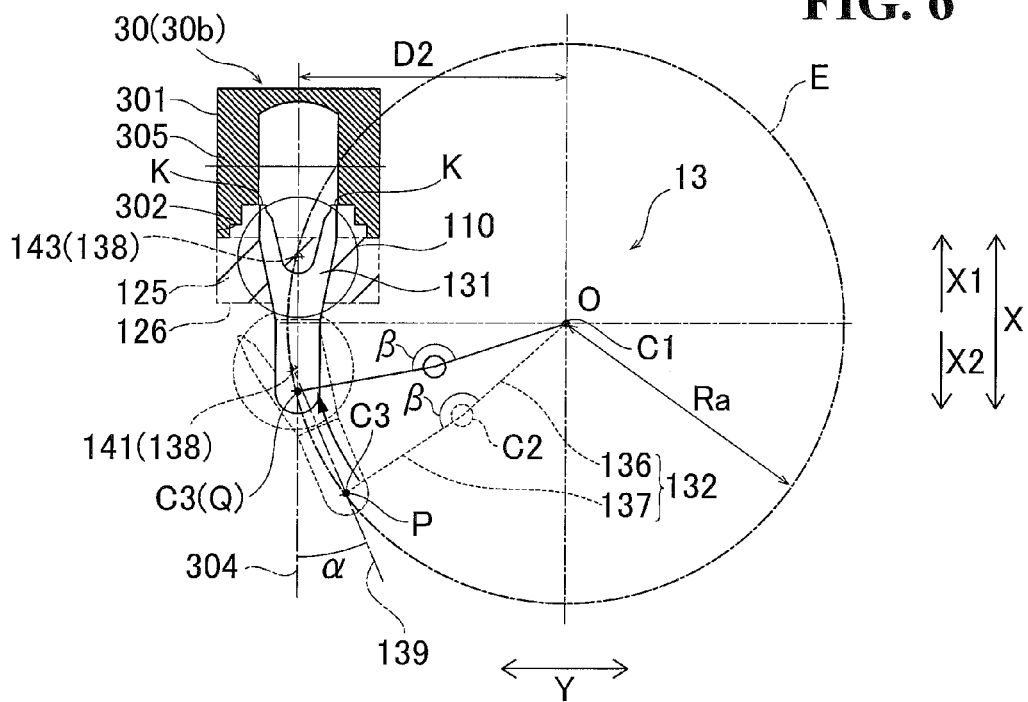
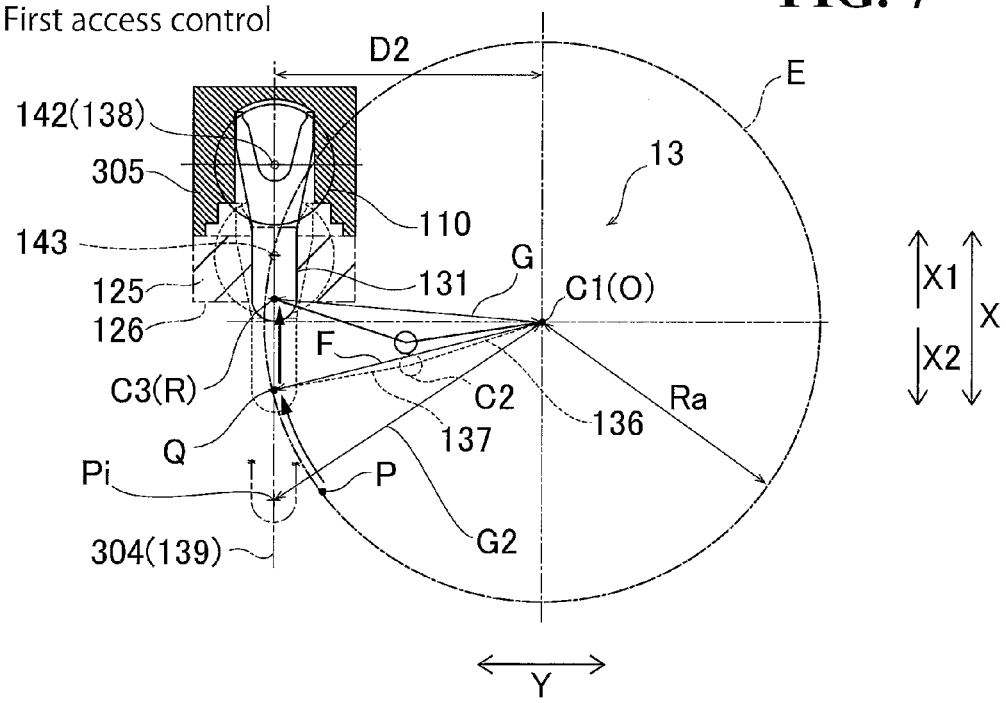

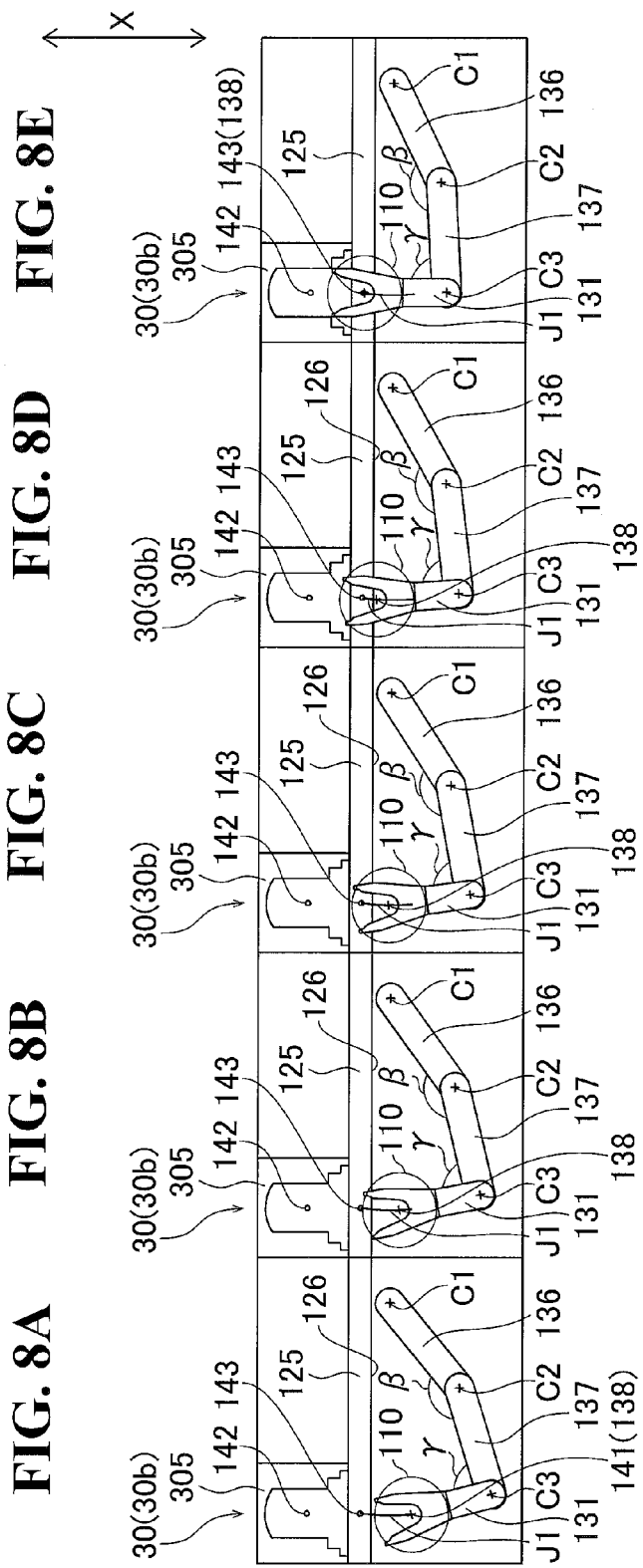

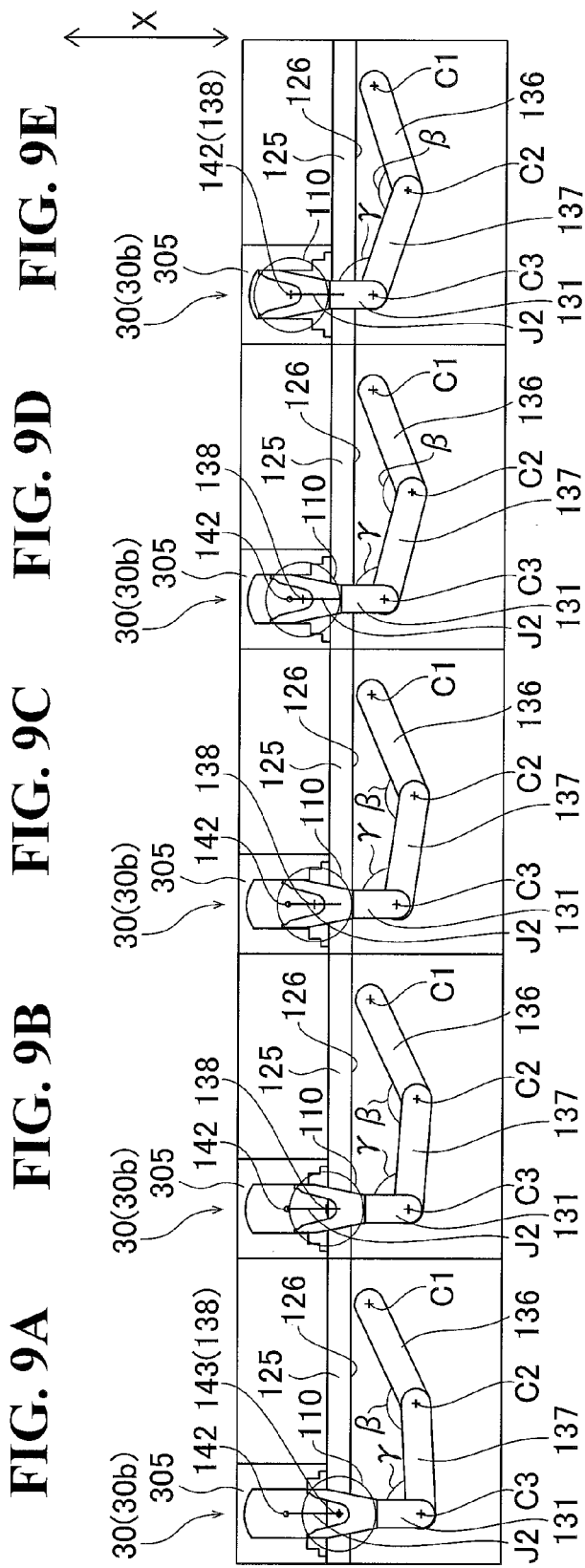

SUBSTRATE TRANSFER ROBOT, SUBSTRATE TRANSFER SYSTEM, AND METHOD FOR TRANSFERRING SUBSTRATE

CROSS-REFERENCE TO RELATED APPLICATIONS

The present application claims priority under 35 U.S.C. §119 to Japanese Patent Application No. 2013-108413, filed May 22, 2013. The contents of this application are incorporated herein by reference in their entirety.

BACKGROUND

1. Field of the Invention

The present invention relates to a substrate transfer robot, a substrate transfer system, and a method for transferring a substrate.

2. Discussion of the Background

Japanese Unexamined Patent Application Publication No. 2011-228627 discloses a substrate transfer robot with a hand capable of approaching a substrate storage on which a substrate (semiconductor wafer) is placed, in order to hold the substrate.

The substrate transfer robot disclosed in Japanese Unexamined Patent Application Publication No. 2011-228627 is a horizontally articulated substrate transfer robot including an arm and a hand. The arm is made up of a first arm and a second arm coupled in series to each other toward a distal end of the arm. The hand is coupled to the distal end of the arm. The substrate transfer robot is fixed in a robot installment area and takes a substrate into and out of a plurality of substrate storages (substrate storage cassettes) aligned along the robot installment area. When the hand approaches the substrate storage in order to take the substrate into or out of the substrate storage, the hand makes linear movement between an access start position, which is at a distance from the substrate storage, and a substrate placement position, which is in the area of the substrate storage. Here, a hand center line, which is oriented from the base of the hand to the distal end of the hand, overlaps an access straight line of the substrate storage (that is, the hand is immediately in front of the substrate storage). The access straight line is a straight line in a direction that is perpendicular to a front surface of the substrate storage and in which the substrate is taken in and out. The substrate transfer robot performs a similar access operation with respect to a substrate storage (processing chamber) of a processing apparatus, where the substrate is subjected to a predetermined kind of processing.

SUMMARY

According to one aspect of the present disclosure, a substrate transfer robot includes a hand, an arm, and a controller. The hand is configured to approach a substrate storage on which a substrate is placed, and is configured to hold the substrate. The arm is configured to move the hand. The controller is configured to control a position and an orientation of the hand. When in plan view, a substrate holding center at a time when the hand is holding the substrate is adjacent to the substrate storage and is at an access start position that is at a predetermined distance from the substrate storage, the substrate holding center reaches a substrate placement position in the substrate storage with a hand center line inclined toward an access straight line and with the hand center line overlapping the access straight line. The hand center line is oriented from a base of the hand to a distal end of the hand. The access straight line is perpendicular to a front surface of the substrate storage and is associated with the hand approaching the substrate storage.

According to another aspect of the present disclosure, a substrate transfer system includes a robot installment area and a substrate transfer robot. The substrate transfer robot is disposed in the robot installment area. The substrate transfer robot includes a hand and an arm. The hand is configured to approach a substrate storage on which a substrate is placed, and configured to hold the substrate. The arm is configured to move the hand. The substrate transfer robot is configured to move the hand such that when in plan view, a substrate holding center at a time when the hand is holding the substrate is adjacent to the substrate storage and is at an access start position that is at a predetermined distance from the substrate storage, the substrate holding center reaches a substrate placement position in the substrate storage with a hand center line inclined toward an access straight line and with the hand center line overlapping the access straight line. The hand center line is oriented from a base of the hand to a distal end of the hand. The access straight line is perpendicular to a front surface of the substrate storage and is associated with the hand approaching the substrate storage.

According to another aspect of the present disclosure, a method is for transferring a substrate using a hand of a substrate transfer robot approaching a substrate storage on which the substrate is placed. The method includes inclining a hand center line toward an access straight line with in plan view, a substrate holding center at a time when the hand is holding the substrate being adjacent to the substrate storage and being at an access start position that is at a predetermined distance from the substrate storage. The hand center line is oriented from a base of the hand to a distal end of the hand. The access straight line is perpendicular to a front surface of the substrate storage and is associated with the hand approaching the substrate storage. An orientation of the hand center line is changed between the access start position and a substrate placement position in the substrate storage so as to make the hand center line overlap the access straight line, and the substrate holding center is controlled to reach the substrate placement position with the hand center line overlapping the access straight line.

According to the other aspect of the present disclosure, a substrate transfer robot includes a hand and an arm. The arm is coupled to the hand at a distal end of the arm. At an access start position, a position and an orientation of the hand at a time when the hand is approaching a substrate storage on which the substrate is placed are such that the hand is inclined toward an access straight line that is perpendicular to a front surface of the substrate storage. At a substrate placement position in the substrate storage, the position and the orientation of the hand at the time when the hand is approaching the substrate storage are set along the access straight line.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein:

FIG. 6 is a conceptual diagram illustrating a movement of a hand from an access start position to an intermediate access position under the first access control;

FIG. 7 is a conceptual diagram illustrating a movement of the hand from the intermediate access position to a substrate placement position under the first access control;

FIGS. 8A to 8E are plan views of the substrate transfer system according to the embodiment, illustrating in a stepwise manner a movement from the access start position to the intermediate access position in the access operation under the first access control; and FIGS. 9A to 9E are plan views of the substrate transfer system according to the embodiment, illustrating in a stepwise manner a movement from the intermediate access position to the substrate placement position in the access operation under the first access control.

DESCRIPTION OF THE EMBODIMENTS

Figure 1:
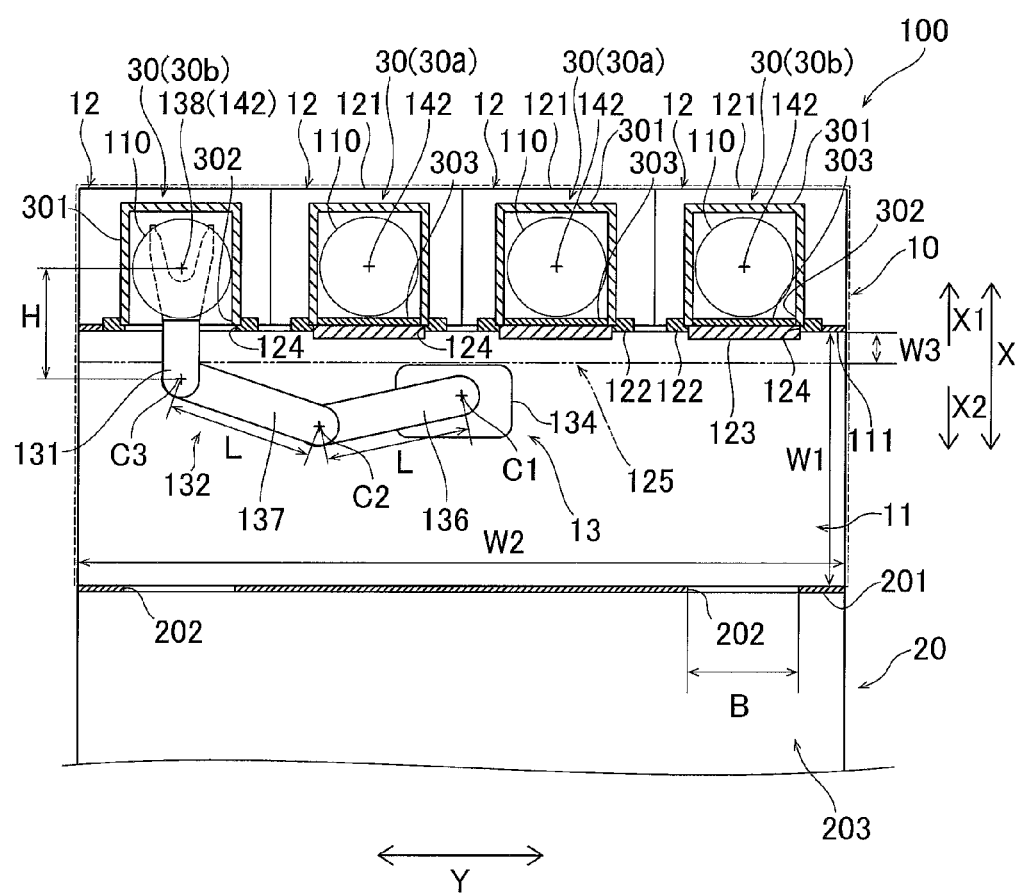
FIG. 1 is a plan view of a substrate processing system according to an embodiment, illustrating a general arrangement of the substrate processing system.

The embodiments will now be described with reference to the accompanying drawings, wherein like reference numerals designate corresponding or identical elements throughout the various drawings.

First, by referring to FIGS. 1 to 7, a configuration of a substrate processing system 100 according to an embodiment will be described. In the following description of this embodiment, the substrate transfer system is applied to a substrate processing system equipped with a processing apparatus that processes semiconductor substrates.

Figure 2:
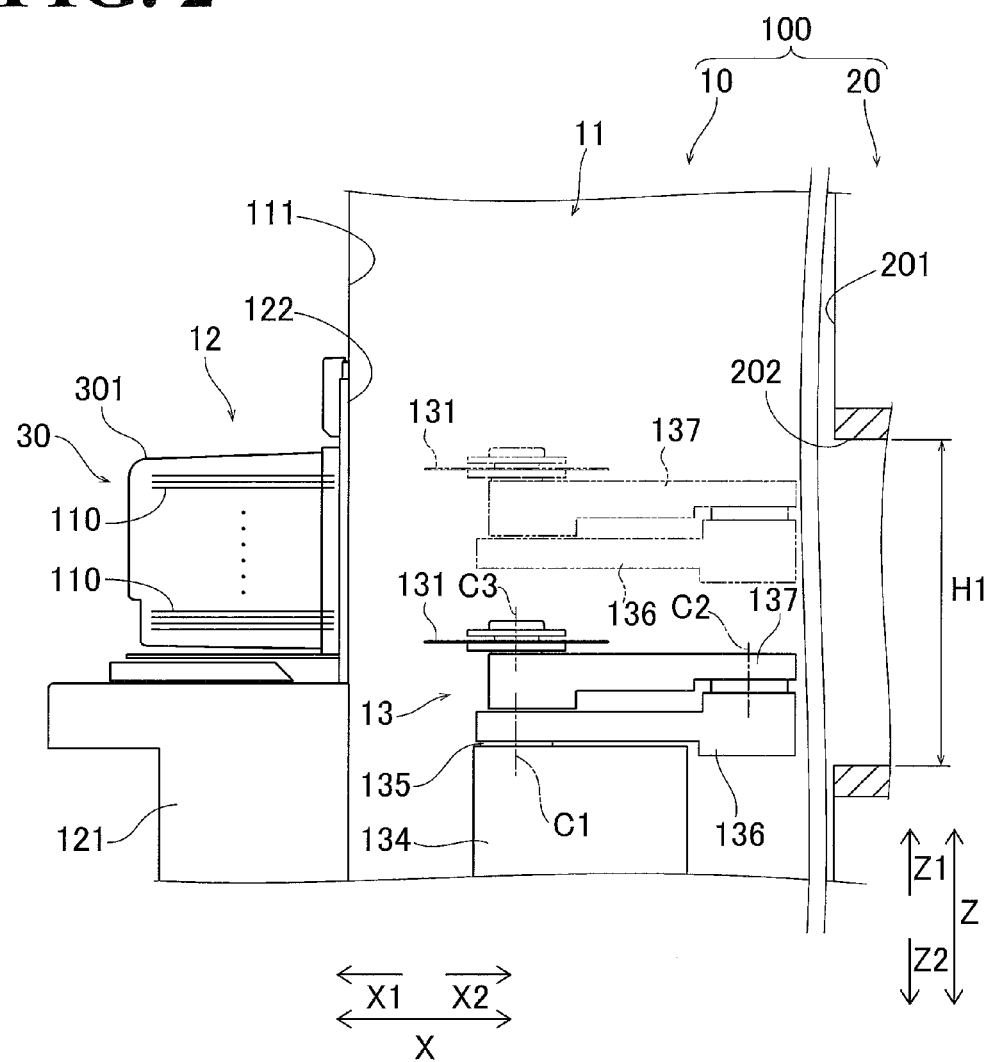
FIG. 2 is a schematic side view of the substrate processing system according to the embodiment, illustrating a general arrangement of the substrate processing system.

As shown in FIGS. 1 and 2, the substrate processing system 100 includes a substrate transfer system 10 and a processing apparatus 20. The substrate transfer system 10 transfers substrates 110. In the substrate processing system 100, the substrate transfer system 10 transfers a substrate 110 to the processing apparatus 20. The processing apparatus 20 processes the transferred substrate 110 in a production process of semiconductor devices.

As shown in FIG. 1, the substrate transfer system 10 includes a robot installment area 11, a plurality of (four) load ports 12, and a substrate transfer robot 13. In the load ports 12, cassettes 30 are disposed to accommodate the substrates 110. The substrate transfer robot 13 is disposed in the robot installment area 11. The substrate transfer system 10 is a system in which the substrate transfer robot 13 transfers the substrates 110 between the cassettes 30 and the processing apparatus 20. The cassettes 30 are examples of the "substrate storage".

In plan view (in plan view), the substrate transfer system 10 has an outer shape (as indicated by the broken line shown in FIG. 1) that is a combination of the installment area of the load ports 12 and the robot installment area 11, in which the substrate transfer robot 13 is installed. The robot installment area 11 is a box-shaped area that has a rectangular shape in plan view surrounded by a front wall 111, on which the load ports 12 are arranged, and by a rear wall 201 and side walls of the processing apparatus 20. The substrate transfer system 10 also includes an FFU (Fan Filter Unit), not shown, to keep the air in the robot installment area 11 clean. In the following description, the direction X in plan view, in which the front wall 111 and the rear wall 201 face each other, will be referred to as a front-rear direction, and the longitudinal direction (Y direction) in plan view along the front wall 111 and the rear wall 201 will be referred to as a lateral direction. The robot installment area 11 has a width W1 in the front-rear direction and a width W2 in the lateral direction.

Each of the cassettes 30 is a semiconductor wafer container that is open on the front and conforms with the SEMI (Semiconductor Equipment and Materials International) standards. Such a container is referred to as a FOUP (Front Open Unified Pod). As shown in FIG. 1, each cassette 30 includes a container main body 301 and a container door 303. The container main body 301 has a front opening 302. The container door 303 is removably fitted with the front opening 302. The container main body 301 and the container door 303 of each cassette 30 define a hermetically sealed space. The space serves as a locally clean area to ensure that the container main body 301 can accommodate a plurality of substrates 110. Each cassette 30 is capable of accommodating the plurality of substrates 110 at different height positions of the container main body 301. For example, the four cassettes 30 each have 25 placement positions in the vertical direction, which ensures that a maximum of 25 substrates 110 can be accommodated in stack.

Each of the load ports 12 holds the cassette 30 accommodating the substrates 110 and has a function to open and close the inside of the cassette 30 relative to the robot installment area 11. The load ports 12 are disposed on the front side (X1 direction side) of the robot installment area 11 to abut on the front wall 111, and are aligned with each other in the Y direction along the front wall 111. Each load port 12 includes a stand 121, a front plate 122, and a port door 123. As shown in FIG. 2, each load port 12 is capable of accepting one cassette 30 in such a manner that the one cassette 30 is detachably fixed (mounted) to the upper surface of the stand 121. The front plate 122 is formed within a perpendicular plane along the Y direction and constitutes a part of the front wall 111 of the robot installment area 11. As shown in FIG. 1, the front plate 122 is in the form of a window (frame) with an opening 124. The opening 124 is opened and closed by the port door 123. Each load port 12 includes a door opening/closing mechanism, not shown. The door opening/closing mechanism holds the port door 123 and the container door 303 of the cassette 30 to pull the port door 123 and the container door 303 rearward (in the X2 direction) through the opening 124, and moves (withdraws) the port door 123 and the container door 303 downward (in the Z2 direction, see FIG. 2). In this manner, the door opening/closing mechanism opens the internal space of the cassette 30 to the robot installment area 11. When the cassette 30 is taken out, the door opening/closing mechanism closes the port door 123 and the container door 303.

Figure 3:
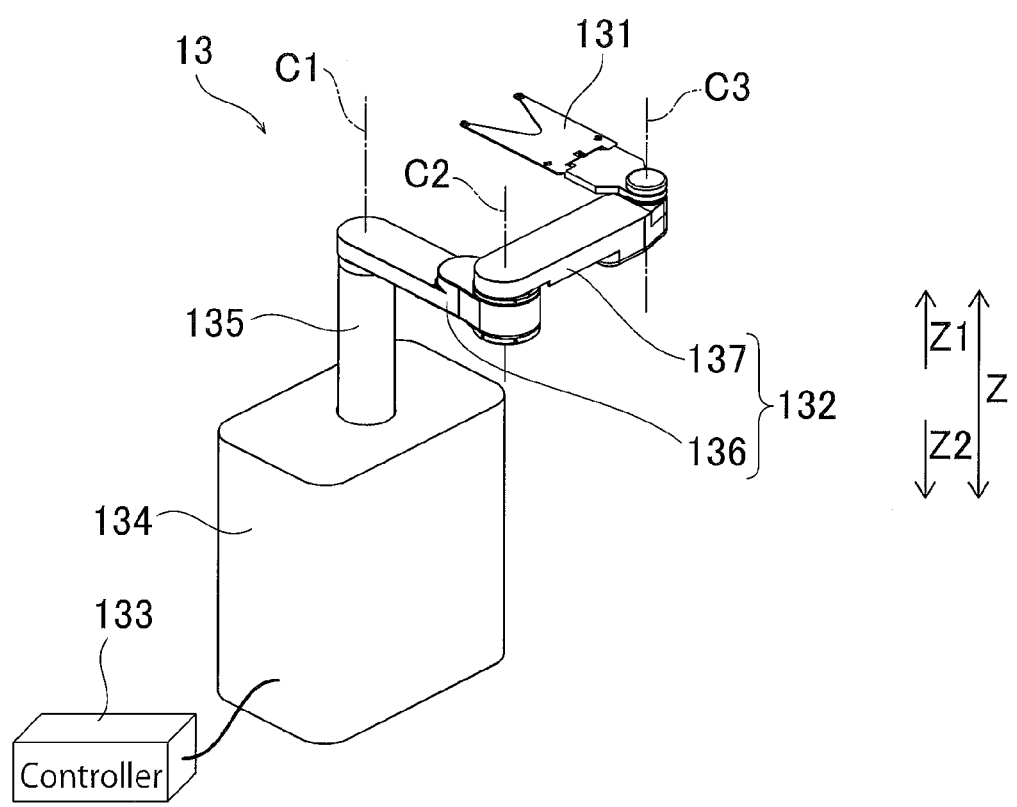
FIG. 3 is a perspective view of a substrate transfer robot of the substrate processing system according to the embodiment.

As shown in FIG. 3, the substrate transfer robot 13 is a horizontal multi-articular robot and includes a hand 131, an arm 132, and a controller 133. The hand 131 is capable of approaching the cassette 30 and holding the substrate 110. The arm 132 moves the hand 131. The controller 133 controls the elements of the substrate transfer robot 13. As shown in FIG. 1, the substrate transfer robot 13 is at a position in the robot installment area 11 near the cassette 30 (that is, at a position on the X1 direction side). The arm 132 is coupled to the hand 131 at the distal end of the arm 132, and includes a plurality of arm members. The plurality of arm members are coupled together to be elongate from a swing center (turning center) C1, described later, of the arm 132 to the distal end of the arm 132 in such a manner that the arm members are turnable relative to each other at their ends. More specifically, the substrate transfer robot 13 further includes a base member 134 and a support shaft 135. In this embodiment, the arm 132 includes two arms, namely, a first arm 136 and a second arm 137. The first arm 136 and the second arm 137 are examples of the "arm sections".

As shown in FIG. 3, the support shaft 135 is supported by the base member 134. Also the support shaft 135 is elongate in a direction perpendicular to the upper surface of the base member 134. To the upper end of the support shaft 135, one end of the first arm 136 is coupled. The first arm 136 is turnable on a horizontal plane about the support shaft 135 as a turning axis. To the other end of the first arm 136, one end of the second arm 137 is coupled. The second arm 137 is turnable on a horizontal plane about the one end of second arm 137 coupled to the first arm 136. To the other end of the second arm 137, the hand 131 is coupled. The hand 131 is turnable on a horizontal plane about the portion of connection between the hand 131 and the second arm 137. Also the hand 131 is capable of supporting the edge (outer circumference) of the substrate 110. Thus, the substrate transfer robot 13 ensures that the first arm 136, the second arm 137, and the hand 131 are capable of turning independently (individually) about respective three turning axes, namely, the swing center C1 of the first arm 136, the swing center C2 of the second arm 137, and the swing center C3 of the hand 131. The swing center C1 of the first arm 136 also serves as the swing center of the entire the arm 132 about the support shaft 135.

The first arm 136 and the second arm 137 have approximately the same link lengths. Specifically, as shown in FIG. 1, the link length of the first arm 136, which is from the swing center C1 of the first arm 136 to the swing center C2 of the second arm 137, and the link length of the second arm 137, which is from the swing center C2 of the second arm 137 to the swing center C3 of the hand 131, are approximately the same, namely, length L. This eliminates or minimizes complication of the operation control of the elements at the time of transfer of the substrate 110, as compared with case of the first arm 136 and the second arm 137 having different link lengths. In this embodiment, the hand 131 has a hand length H, which is from the swing center C3 of the hand 131 to a substrate holding center 138 at the time when the hand 131 is holding the substrate 110. The hand length H is smaller than the link length L of each of the first arm 136 and the second arm 137. The hand length H is set such that the maximum length of the hand 131 plus the substrate 110 when the hand 131 is holding the substrate 110 is approximately equal to the entire length of each arm section.

The arm 132, which includes the first arm 136 and the second arm 137, has a working area defined by a circle E having a radius of reachable length Ra (see FIG. 7). In this embodiment, as shown in FIG. 7, the arm 132 has a first distance F and a second distance G. The first distance F is defined between the turning center (swing center) C1 and the distal end of the arm 132 (second arm 137) with the substrate holding center 138 being at an intermediate access position 143, described later (that is, the distance between a point O and a point Q). The second distance G is defined between the turning center C1 and the distal end of the arm 132 (second arm 137) with the substrate holding center 138 being at a substrate placement position 142 in the cassette 30 (that is, the distance between the point O and a point R). The longer distance among the first distance F and the second distance G is equal to or less than the sum of the link lengths of all the plurality of (two) arms (L+L=2L), and equal to or less than the reachable length Ra of the arm 132. Specifically, the arm length of the arm 132 of the substrate transfer robot 13 satisfies the following conditional expression (1).

$$\max\{F, G\} \leq Ra \leq 2L \quad (1)$$

While it is mechanically possible that the reachable length Ra of the arm 132 is equal to the sum of all the link lengths (2L in this embodiment), in practice the reachable length Ra is oftentimes set at equal to or less than 2L as a predetermined value, in consideration of occurrence of a singularity in controlling the arm 132 and occurrence of wobbling of the distal end of the arm. That is, the arm 132 has ranges of opening angles (rotation angles about the turning centers C1 and C2) that are set in consideration of the singularity in controlling the arm and controllability of the position of the distal end of the arm 132. The reachable length Ra is a length as measured between the turning center C1 and the distal end (turning center C3) of the arm 132 (second arm 137) with opening angles that are within the ranges and provide the maximum circumferential length.

Also, as shown in FIG. 2, the substrate transfer robot 13 moves the support shaft 135 up and down to integrally move up and down the first arm 136, the second arm 137, and the hand 131. This enables the substrate transfer robot 13 to take in and out the substrate 110 to and from all the different height positions in the cassette 30.

The controller 133 mainly includes an arithmetic operation device, a memory device, and an input/output device. The arithmetic operation device includes, for example, a CPU. The memory device includes, for example, a ROM and a RAM. The input/output device inputs and outputs control signals between the input/output device and the first arm 136, the second arm 137, the hand 131, and other elements. The controller 133 is taught in advance operations of the elements at the time when the hand 131 transfers the substrate 110. Specifically, for each of the four cassettes 30, the controller 133 is taught in advance operations of the elements associated with the take-in-and-out operation of the substrate 110 (access operation). This ensures that the substrate transfer robot 13 performs a transfer operation of the substrate 110 in accordance with an operation procedure described later.

As shown in FIGS. 1 and 2, the processing apparatus 20 includes the rear wall 201 at the side (X1 direction side) at which the substrate transfer robot 13 and the cassettes 30 are disposed. The rear wall 201 is formed within a perpendicular plane along the Y direction. Also the rear wall 201 is approximately parallel to the front wall 111 to face the front wall 111. An approximately rectangular opening 202 is formed in the rear wall 201. Through the opening 202, the substrate transfer robot 13 approaches a predetermined substrate placement position of a processing chamber 203 in the processing apparatus 20. As shown in FIG. 1, the opening 202 has an opening width B in the horizontal direction (Y direction) to allow the substrate 110 to be inserted through the opening 202. As shown in FIG. 2, the opening 202 has an opening length H1 in the height direction (Z direction). The opening length H1 is larger than the movable ranges of the first arm 136, the second arm 137, and the hand 131 of the substrate transfer robot 13 in the height direction. The processing chamber 203 is an example of the "substrate storage".

The substrate transfer robot 13 with the above-described configuration transfers the substrate 110 in the cassette 30 through the opening 202 to a placement position in the processing apparatus 20, and transfers the substrate 110 in the processing apparatus 20 to a predetermined placement position in the cassette 30.

Figure 4:
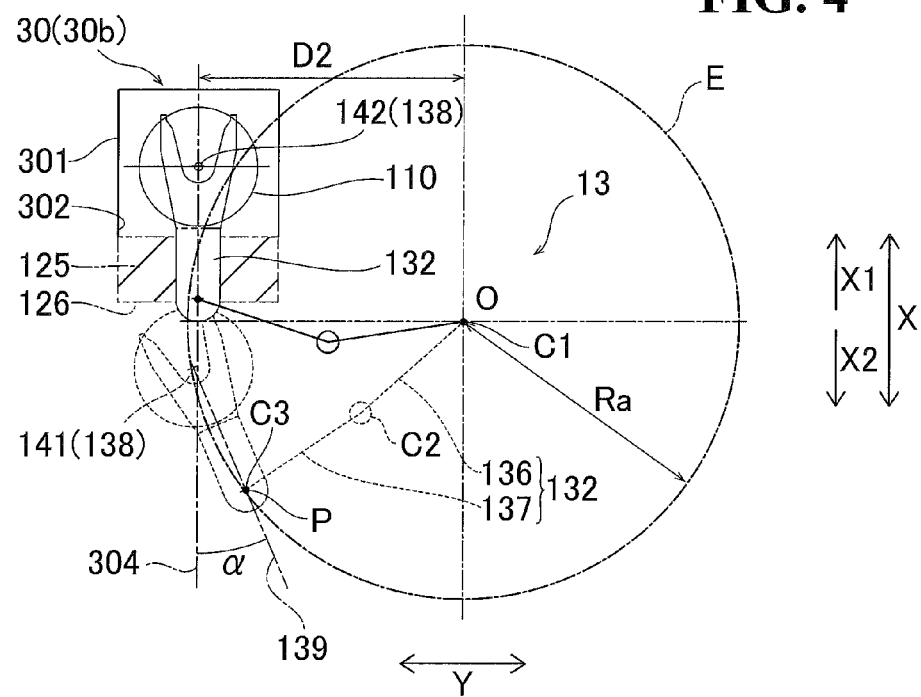
FIG. 4 is a conceptual diagram illustrating first access control performed by the substrate transfer system according to the embodiment.

In this embodiment, as shown in FIG. 4, the substrate transfer robot 13 performs first access control. In the first access control, the controller 133 controls the position and the orientation of the hand 131 so as to incline a hand center line 139 of the hand 131 with respect to an access straight line 304, which is associated with the hand center line 139 of the hand 131 approaching the inside of the cassette 30, when the substrate holding center 138 is at the access start position 141 in plan view (see the broken line shown in FIG. 4). At the same time, the controller 133 controls the hand 131 to move so as to make the substrate holding center 138 reach the substrate placement position 142 in the cassette 30 with the hand center line 139 overlapping the access straight line 304 (see the solid line shown in FIG. 4). The access start position 141, the hand center line 139, the access straight line 304, and the substrate placement position 142 will be described later.

Figure 5:
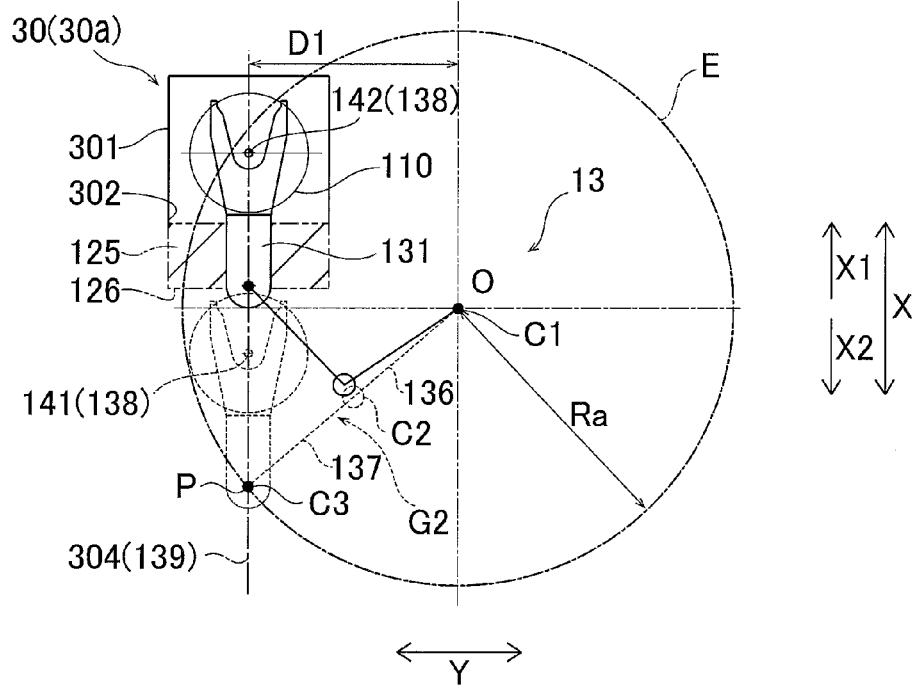
FIG. 5 is a conceptual diagram illustrating second access control performed by the substrate transfer system according to the embodiment.

It should be noted that in this embodiment, the controller 133 does not perform the first access control with respect to all the cassettes 30. The controller 133 performs the access operation control according to the position of the cassette 30 to be accessed (its distance from the substrate transfer robot 13). Specifically, as shown in FIG. 5, when the controller 133 intends to make the hand 131 approach a cassette 30a, which is closer to the substrate transfer robot 13, then the controller 133 performs second access control. In the second access control, the controller 133 makes the hand center line 139 overlap the access straight line 304 with the substrate holding center 138 being at the access start position 141. As shown in FIG. 4, when the controller 133 intends to make the hand 131 approach a cassette 30b, which is farther away from the substrate transfer robot 13 than the cassette 30a is away from the substrate transfer robot 13, then the controller 133 performs the first access control. In the first access control, the controller 133 inclines the hand center line 139 with respect to the access straight line 304 within the movable range of the arm 132 (radius Ra) with the substrate holding center 138 being at the access start position 141. In the configuration shown in FIG. 1, distant cassettes 30b corresponds to the two outermost cassettes 30 in the lateral directions (in the Y directions), while the closer cassette 30a corresponds to the two innermost cassettes 30 in the lateral directions.

The first access control and the second access control will be described below by referring to FIG. 1 and FIGS. 4 to 7.

First, description will be made with regard to an operation condition for the access operation of making the hand 131 approach the cassette 30. As shown in FIGS. 4 and 5, the working area of the arm 132 is within the circle E of radius Ra. It is therefore necessary that the turning center C3 of the distal end of the second arm 137 (the base of the hand 131) be within the circle E.

The access operation is an operation of moving the hand 131 from the access start position 141 to the substrate placement position 142 in the cassette 30. The access start position 141 is a position at which the hand 131 starts approaching the cassette 30 and at which the substrate holding center 138 of the hand 131 is adjacent to the cassette 30 and is at a predetermined distance from the cassette 30. In this embodiment, the access start position 141 is set as a predetermined position adjacent to an outer edge 126 of a cassette opening/closing area 125. At this predetermined position, the hand 131 and the substrate 110 held by the hand 131 are outside the cassette opening/closing area 125. The cassette opening/closing area 125 is an operation area provided for a door opening/closing mechanism (not shown) of the load port 12 to open and close the cassette 30, and which has a width (X direction width) W3 specified by the SEMI standards. The access start position 141 is generally set in consideration of operation efficiency, that is, the hand 131 and the substrate 110 held by the hand 131 are positioned as close as possible to the outer edge 126 of the cassette opening/closing area 125. The substrate placement position 142 is a center position of the substrate 110 stored (placed) in the cassette 30.

Also, the hand 131 is controlled so that the substrate holding center 138 at the time when the hand 131 is holding the substrate 110 is positioned at the substrate placement position 142 in the cassette 30. Here, as shown in FIGS. 6 and 7, in the cassette 30, an entrance prohibited area 305 (hatched area) is set in conformity with the SEMI standards. The operation of the hand 131 is controlled to prevent the hand 131 from entering the entrance prohibited area 305. The entrance prohibited area 305 indicates an area within which an inwardly protruding support (not shown) for the substrate 110 in the cassette 30 is allowed to be provided. The SEMI standards specify that the support be within the entrance prohibited area 305. In view of this, in the access operation, keeping the hand 131 out of the entrance prohibited area 305 suffices in ensuring that the hand 131 does not contact (interfere with) the cassette made in conformity with the SEMI standards. As seen from the shape of the entrance prohibited area 305, the hand 131, depending on its shape, is almost unable to make any movement in the cassette 30 other than linear movement along an access straight line 304, which is perpendicular to the front surface (front wall 111 of the robot installment area 11) of the cassette 30, except in the vicinity of the inlet of the cassette 30. In view of this, in the cassette 30, the hand 131 basically needs to make linear movement with the hand center line 139, which extends from the base to the distal end of the hand 131, overlapping the access straight line 304 (X direction). It is noted that the hand center line 139 is specifically a line connecting between the turning center C3 of the hand 131 and the substrate holding center 138 of the hand 131.

Under these operation conditions, the second access control is as shown in FIG. 5. The controller 133 makes the hand center line 139 overlap the access straight line 304 with the substrate holding center 138 being at the access start position 141 (see the broken line). In this state, the controller 133 moves the hand 131 linearly in the X1 direction until the substrate holding center 138 reaches the substrate placement position 142. The access operation under the second access control ensures that the turning center C3 (point P) of the distal end of the second arm 137 (the base of the hand 131) is within the circle E of radius Ra with the hand center line 139 overlapping the access straight line 304 at the access start position 141. In view of this, the controller 133 performs the second access control when a distance G2 between the turning center C1 and the turning center C3 at the access start position 141 (the distance between the point O and the point P) is equal to or less than Ra.

That is, the second access control is performed when the following conditional expression (2) is satisfied.

$$G2 \leq Ra \qquad (2)$$

In view of this, as shown in FIG. 5, the second access control is performed with respect to the cassette 30a, which is positioned within the range defined by the turning center C1 and a distance D1 in the Y direction. When the cassette 30a is positioned at the distance D1, the turning center C3 (point P) at the time when the hand center line 139 overlaps the access straight line 304 at the access start position 141 is on the circle E.

For the cassette 30b, which is at more than the distance D1 in the Y direction from the substrate transfer robot 13 (turning center C1), the controller 133 performs the first access control.

In the first access control, as shown in FIGS. 4 and 6, the controller 133 inclines the hand center line 139 (at an inclination angle α) with respect to the access straight line 304 within the movable range of the arm 132 (within the circle E of radius Ra) with the substrate holding center 138 of the hand 131 being at the access start position 141 (at the hand position indicated by the broken line). Thus, in this embodiment, the position and the orientation of the hand 131 in the access operation under the first access control are such that at the access start position 141, the hand 131 is inclined toward the turning center C1 of the first arm 136 of the substrate transfer robot 13 with respect to the access straight line 304.

Then, as shown in FIG. 6, the controller 133 changes the orientation of the hand center line 139 between the access start position 141 and the substrate placement position 142 so as to make the hand center line 139 overlap the access straight line 304. The controller 133 also makes the hand center line 139 overlap the access straight line 304 with the substrate holding center 138 being at the intermediate access position 143 (the hand position indicated by the solid line). The intermediate access position 143 is at a position further toward the cassette 30b (further on the X1 direction side) beyond the outer edge 126 of the cassette opening/closing area 125.

The intermediate access position 143 is a position at which the substrate holding center 138 of the hand 131 is positioned further toward the cassette 30 beyond the access start position 141. In this embodiment, the intermediate access position 143 is set as a position that is further toward the cassette 30b (further on the X1 direction side) beyond the outer edge 126 of the cassette opening/closing area 125, and that is outside the entrance prohibited area 305 for the hand 131 in the cassette 30b. The intermediate access position 143 is determined according to the shape of the hand 131 and the shape of the entrance prohibited area 305 in the cassette 30b (30), and is a predetermined position at which distal ends K of the hand 131 are adjacent to the entrance prohibited area 305. In the example shown in FIG. 6, the intermediate access position 143 is set at a position to make the distal ends K of the hand 131 be immediately before the entrance prohibited area 305, falling narrowly short of contacting the entrance prohibited area 305. Also in FIG. 6, the intermediate access position 143 is set at a position to make the distal ends K of the hand 131 be beyond the front opening 302 into the cassette 30.

Here, in the example shown in FIG. 6, the hand 131 is of the edge grip type, and thus in plan view, the distal ends K of the hand 131 holding the substrate 110 protrude beyond the substrate 110. In contrast, when the hand is of, for example, the negative-pressure (vacuum) chuck type or the electrostatic chuck type, the distal ends K of the hand 131 in some cases coincide with the edge of the substrate 110, instead of protruding beyond the substrate 110. Here, the intermediate access position may be set further into the cassette 30b beyond the intermediate access position 143 shown in FIG. 6. Thus, the intermediate access position is determined according to the shape of the hand and the shape of the entrance prohibited area 305 in the cassette 30.

In this embodiment, from a state in which in plan view the substrate holding center 138 of the hand 131 is at the access start position 141 and the hand center line 139 is inclined with respect to the access straight line 304 (the hand position indicated by the broken line in FIG. 6), the controller 133 moves the hand 131 to the intermediate access position 143 with a constant relative angle β maintained between the first arm 136 and the second arm 137. In the meantime, the turning center C3 of the distal end of the arm 132 (second arm 137) draws an arc-shaped track of uniform radius between the access start position 141 and the intermediate access position 143.

Also, the inclination angle α of the hand center line 139 with respect to the access straight line 304 at the access start position 141 is set at an angle at which the hand center line 139 overlaps the access straight line 304 when the hand 131 is moved to the intermediate access position 143. Thus, first, the posture (determined by the rotation angles about the turning centers C1, C2, and C3) at the intermediate access position 143 (the hand position indicated by the solid line in FIG. 6) is determined. Here, the relative angle β between the first arm 136 and the second arm 137 is the relative angle β at the access start position 141. Then, the entire arm 132 is brought into swing movement about the turning center C1 from the intermediate access position 143 to the access start position 141, with the rotation angle about the turning center C2 being fixed. Here, the inclination angle of the hand center line 139 with respect to the access straight line 304 is the inclination angle α.

As shown in FIG. 7, after the controller 133 has made the hand center line 139 overlap the access straight line 304 at the intermediate access position 143, the controller 133 controls the hand 131 to make linear movement in the X1 direction until the substrate holding center 138 reaches the substrate placement position 142, similarly to the second access control. Specifically, in this embodiment, the position and the orientation of the hand 131 at the time of access of the hand 131 under the first access control are set such that the hand 131 is along the access straight line 304 (that is, the hand center line 139 overlaps the access straight line 304) at the substrate placement position 142. In this manner, the first access control is performed.

The first distance F is defined between the turning center C3 and the turning center C1 (that is, distance between the point O and the point Q) with the hand center line 139 overlapping the access straight line 304 at the intermediate access position 143 (the hand position indicated by the broken line in FIG. 7). The second distance G is defined between the turning center C3 and the turning center C1 (the distance between the point O and the point R) with the substrate holding center 138 reaching the substrate placement position 142 (the hand position indicated by the solid line in FIG. 7). The access operation under the first access control ensures that the longer distance among the first distance F and the second distance G is within the circle E of radius Ra.

A distance G2 is defined between the turning center C3 and the turning center C1 under the assumption that the hand center line 139 overlaps the access straight line 304 at the access start position 141 (that is, distance G2 is the distance between the point O and a point Pi as shown in FIG. 7). The controller 133 performs the first access control when the distance G2 is larger than the radius Ra and when the longer distance among the first distance F (the distance between the point O and the point Q) and the second distance G (the distance between the point O and the point R) is within the circle E of radius Ra.

That is, the first access control is performed when the following conditional expression (3) is satisfied.

$$\max\{F,G\} \leq Ra \leq G2 \qquad (3)$$

Thus, the first access control ensures an access operation also with respect to the cassette 30b, which is apart from the turning center C1 in the Y direction by the distance D2 (>D1) as shown in FIGS. 6 and 7. As a result, the first access control ensures access to the cassette 30b when the cassette 30b is so distant that the second control might cause the distal end (turning center C3) of the second arm 137 at the access start position 141 to protrude beyond the circle E of radius Ra. Such a manner of using the first access control and the second access control serves as a basis of the conditional expression (1), which is concerned with the arm length of the substrate transfer robot 13. In other words, the cassettes 30 (30a and 30b) of the substrate transfer system 10 are installed within a range that satisfies the conditional expression (1).

Next, description will be made with regard to a specific operation procedure for substrate transfer performed by the substrate transfer system 10 according to this embodiment. Referring to FIGS. 4, 6, 8A to 8E, and 9A to 9E, the following exemplary specific access operation of the hand 131 is made with respect to the cassette 30b, which is farther away from the substrate transfer robot 13. Also in the following description, the substrate 110 held by the hand 131 is transferred to (be stored in) the cassette 30b. Since this access operation is made with respect to the cassette 30b, which is farther away from the substrate transfer robot 13, the controller 133 controls the position and the orientation of the hand 131 under the first access control.

First, as shown in FIG. 8A, the substrate transfer robot 13 positions the substrate holding center 138 of the hand 131 at the access start position 141. Here, the controller 133 controls the orientation of the hand 131 to incline the hand center line 139 with respect to the access straight line 304 (see FIG. 4). Then, as shown in FIGS. 8B to 8E, the substrate transfer robot 13 brings the entire arm 132 into swing movement about the turning center C1 from the access start position 141. Thus, the substrate holding center 138 of the hand 131 is positioned at the intermediate access position 143. Here, the substrate holding center 138 draws an arc-shaped track J1 from the access start position 141 to the intermediate access position 143. In the meantime, the relative angle β between the first arm 136 and the second arm 137 remains constant. Also, a relative angle γ between the second arm 137 and the hand 131 remains constant.

As shown in FIGS. 8E and 9A, when the substrate holding center 138 of the hand 131 reaches the intermediate access position 143, the hand center line 139 overlaps the access straight line 304 (see FIG. 6). Then, as shown in FIGS. 9B to 9E, the substrate transfer robot 13 controls the hand 131 to make linear movement along the access straight line 304 so as to position the substrate holding center 138 from the intermediate access position 143 to the substrate placement position 142. Here, the substrate holding center 138 draws a linear track J2 from the intermediate access position 143 to the substrate placement position 142.

During this processing, the relative angle β between the first arm 136 and the second arm 137 and the relative angle γ between the second arm 137 and the hand 131 continuously change Specifically, the controller 133 controls the first arm 136, the second arm 137, and the hand 131 to respectively turn about the turning centers C1, C2, and C3. Then, the controller 133 controls the hand 131 to make linear movement while keeping the hand center line 139 overlapping the access straight line 304.

After the substrate transfer robot 13 has positioned the substrate holding center 138 of the hand 131 at the substrate placement position 142, the substrate transfer robot 13 places the substrate 110 in the cassette 30b and pulls the hand 131 out of the cassette 30b. The pulling-out operation of the hand 131 out of the cassette 30b takes the track identical to the track of the access operation. That is, the pulling-out operation of the hand 131 is opposite of the operation of FIGS. 8A to 8E through FIGS. 9A to 9E. In this manner, the substrate is transferred.

Incidentally, a recent trend is to increase the number of cassettes to be installed in an attempt to improve processing efficiency of substrate processing apparatuses. As the number of the cassettes increases to be installed, some cassettes become more distant from the substrate transfer robot, to the detriment of the access operation of the substrate transfer robot. Increasing the size of the substrate transfer robot results in an increased size of the entire equipment. In view of this, there is a need for a substrate transfer robot capable of approaching distant cassettes without increasing the conventional size of the substrate transfer robot.

When the hand approaches the cassette, the conventional substrate transfer robot disclosed in Japanese Unexamined Patent Application Publication No. 2011-228627 linearly moves the hand between the access start position and the substrate placement position with the hand center line overlapping the access straight line. This requires that at the access start position, the distal end of the arm (the base of the hand) reach an extension of the access straight line. This can prevent a cassette from being installed at a more distant position.

In view of this, in this embodiment as described above, when the substrate holding center 138 is in the state of being at the access start position 141 in plan view, the controller 133 controls the position and the orientation of the hand 131 such that the substrate holding center 138 reaches the substrate placement position 142 with the hand center line 139 inclined with respect to the access straight line 304, and with the hand center line 139 overlapping the access straight line 304. This ensures that the distal end of the arm 132 (the base of the hand 131) is positioned near the substrate transfer robot 13 with the hand center line 139 inclined with respect to the access straight line 304 at the access start position 141. This, in turn, enables the hand 131 to approach the cassette 30b disposed as far as possible insofar as the distal end (the turning enter C3) of the arm 132 is disposed on the extension of the access straight line 304 at the substrate placement position 142. Thus, the hand 131 is able to approach the cassette 30b without increasing the size of the substrate transfer robot 13 (without elongating the arm length) even when the cassette 30b is so distant that the distal end (the turning center C3) of the arm 132 cannot be disposed on the extension of the access straight line 304 at the access start position 141. Thus, with the number of cassettes to be installed on the increase, the substrate transfer robot 13 according to this embodiment is useful especially with access to the cassette 30 as the substrate storage.

This advantageous effect that the substrate transfer robot 13 according to this embodiment provides can be said in other words; the substrate transfer system 10 can be reduced in size by shortening the arm length of the atm 132 necessary for approaching the plurality of cassettes 30. Specifically, assume that the design demands a specific number of cassettes 30 (four cassettes 30 in the example shown in FIG. 1) to be installed in the substrate transfer system 10. Here, the SEMI standards specify the pitch in the lateral direction (Y direction) for this number of the cassettes 30. Thus, the arm length required for approaching all the cassettes 30 is determined, and a lateral width W2 of the robot installment area 11 is also determined. The front-to-rear width W1 of the robot installment area 11 is determined according to a minimum swing radius. The minimum swing radius is obtained when the arm 132 and the hand 131 swing in folded state. Specifically, the front-to-rear width W1 of the robot installment area 11 is determined such that the distance between the turning center C1 and the rear wall 201 equals the sum of the minimum swing radius and a predetermined safety margin. Thus, when the number of cassettes 30 to be installed, the substrate transfer system 10 according to this embodiment shortens the arm length of the substrate transfer robot 13 required for approaching all the cassettes 30. This reduces the front-to-rear width W1 of the robot installment area 11 and minimizes the size of the substrate transfer system 10.

In this embodiment, as described above, the controller 133 changes the orientation of the hand center line 139 between the access start position 141 and the substrate placement position 142 so as to make the hand center line 139 overlap the access straight line 304. At the same time, the controller 133 makes the substrate holding center 138 of the hand 131 reach the substrate placement position 142 with the hand center line 139 overlapping the access straight line 304. This eliminates the need for the operation of, for example, stopping the hand 131 at a predetermined position to change the orientation of the hand 131. Instead, the hand 131 is moved between the access start position 141 and the substrate placement position 142 within the movable range (within the circle E) of the arm 132, while at the same time the hand center line 139 is made to overlap the access straight line 304 in conjunction with the movement of the hand 131.

In this embodiment, as described above, the controller 133 makes the hand center line 139 overlap the access straight line 304 with the substrate holding center 138 being at the intermediate access position 143, which is further toward the cassette 30 beyond the access start position 141. The controller 133 also controls the hand 131 to make linear movement with the hand center line 139 overlapping the access straight line 304 between the intermediate access position 143 and the substrate placement position 142. Thus, the hand 131 makes linear movement, which is simple and more likely to provide accuracy, between the intermediate access position 143 and the substrate placement position 142 in the cassette 30. This ensures that the hand 131 approaches the inside of the cassette 30 with maximized position accuracy, eliminating or minimizing the hand 131 interfering with (contacting) the inside of the cassette 30.

In this embodiment, the first distance F is defined between the distal end (turning center C3) of the arm 132 and the turning center C1 with the substrate holding center 138 being at the intermediate access position 143. The second distance G is defined between the turning center C1 and the distal end (turning center C3) of the arm 132 with the substrate holding center 138 being at the substrate placement position 142. Here, as described above by referring to the conditional expression (1), the arm 132 is configured such that the longer distance among the first distance F and the second distance G is equal to or less than the sum of the link lengths (2L) of all the arms (first arm 136 and second arm 137) constituting the arm 132, and is equal to or less than the reachable length Ra of the arm 132. Thus, the hand 131 is able to approach the cassette 30 even when the cassette 30 is so distant that it is impossible or difficult to overlap the hand center line 139 with the access straight line 304 at the access start position 141, insofar as the access ensures that the longer distance among the first distance F and the second distance G is equal to or less than the length of the sum (2L) of the link lengths, and equal to or less than the reachable length Ra.

In this embodiment, as described above, the access start position 141 is set at a position at which the substrate holding center 138 is adjacent to the outer edge of the cassette opening/closing area 125. The intermediate access position 143 is set at a position that is further toward the cassette 30 beyond the outer edge 126 of the cassette opening/closing area 125 and that is outside the entrance prohibited area 305 of the hand 131 in the cassette 30. This ensures that the hand center line 139 is kept in inclined state with respect to the access straight line 304 (toward the side approaching the substrate transfer robot 13) until the hand 131 reaches the intermediate access position 143, which is further toward the cassette 30 beyond the outer edge 126 of the cassette opening/closing area 125. This enables the hand 131 to readily approach the substrate placement position 142 in the cassette 30 with the hand center line 139 overlapping the access straight line 304, even when the cassette 30 is so distant that it is impossible or difficult to overlap the hand center line 139 with the access straight line 304 at the access start position 141. This case also eliminates or minimizes the hand 131 interfering with the cassette 30 in the entrance prohibited area 305.

In this embodiment, as described above, the intermediate access position 143 is determined according to the shape of the hand 131 and the shape of the entrance prohibited area 305 in the cassette 30, and is set at a predetermined position at which the distal end of the hand 131 is adjacent to the entrance prohibited area 305. Thus, according to the shape of the hand 131 and the shape of the entrance prohibited area 305 in the cassette 30, the hand center line 139 can be inclined with respect to the access straight line 304 (to the side approaching the substrate transfer robot 13) to as far as a position that makes the distal end of the hand 131 adjacent to the entrance prohibited area 305. This enables the hand 131 to approach the substrate placement position 142 in the cassette 30 with the hand center line 139 overlapping the access straight line 304, even when the cassette 30 is disposed at an even distant position.

In this embodiment, as described above, from the state in which the substrate holding center 138 of the hand 131 is at the access start position 141 and the hand center line 139 is inclined with respect to the access straight line 304, the controller 133 moves the hand 131 to the intermediate access position 143 with a constant relative angle β maintained between the first arm 136 and the second arm 137, which are next to each other. Thus, while the hand 131 is moving from the access start position 141 to the intermediate access position 143, the relative angle β (rotational angle about the turning center C2) between the first arm 136 and the second arm 137, which are next to each other, remains unchanged. This simplifies the movement control of the hand 131 and saves the controller 133 the load of the access control. Specifically, in this embodiment, the movement of the hand 131 from the access start position 141 to the intermediate access position 143 is realized by the swing of the entire arm 132 about the turning center C1. This further simplifies the movement control from the access start position 141 to the intermediate access position 143.

In this embodiment, as described above, when the controller 133 controls the hand 131 to approach the closer cassette 30*a*, the hand center line 139 overlaps the access straight line 304 with the substrate holding center 138 being at the access start position 141 (second access control). When the controller 133 controls the hand 131 to approach the cassette 30*b*, which is disposed at a position farther away than the cassette 30*a*, the hand center line 139 is inclined with respect to the access straight line 304 within the movable range (radius Ra) of the arm 132, with the substrate holding center 138 being at the access start position 141 (first access control). Thus, when the hand 131 approaches the closer cassette 30*a*, the access operation from the access start position 141 to the substrate placement position 142 is achieved by linear movement realized by the hand center line 139 overlapping the access straight line 304. This ensures that the hand 131 approaches the inside of the cassette 30 with maximized accuracy. At the access start position 141, the hand 131 is able to approach the cassette 30*b* with the hand center line 139 inclined with respect to the access straight line 304 at the access start position 141, even when the cassette 30*b* is so distant that it is impossible or difficult to overlap the hand center line 139 with the access straight line 304. Thus, a suitable access operation is selected according to the distance from the substrate transfer robot 13, and the hand 131 is able to approach the cassettes 30 (30*a*, 30*b*) by the suitable access operation.

While in this embodiment the substrate transfer robot has been exemplified as a substrate transfer robot with two arms (first arm and second arm), the substrate transfer robot may be provided with a single arm or equal to or more than three arms.

While in this embodiment the substrate transfer robot has been exemplified as a substrate transfer robot with a single hand, the substrate transfer robot may have equal to or more than two hands.

While in this embodiment the substrate transfer robot 13 has been described as having an edge-grip hand 131, the substrate transfer robot 13 may be provided with a negative-pressure (vacuum) hand or an electrostatic chuck hand. The substrate transfer robot also may be provided with a hand other than an edge-grip hand, a negative-pressure hand, and an electrostatic chuck hand.

While in this embodiment the substrate transfer system 10 has been described as having four load ports 12 to accommodate four cassettes 30, the number of the cassettes (the number of the load ports) may be three or less, or five or more.

In this embodiment, the first access control has been described as controlling the hand 131 to move in an arc-shaped track (to make swing movement) between the access start position 141 and the intermediate access position 143 so as to continuously change the orientation of the hand center line 139. It is also possible in the first access control to perform an operation of adjusting the orientation of the hand 131 at a position between the access start position 141 and the substrate placement position 142. Specifically, a possible operation is to move the hand 131 to a position at which the hand center line 139 can overlap the access straight line 304 (a position at which the distal end of the arm 132 does not protrude beyond the range defined by the circle E even when the hand center line 139 overlaps the access straight line 304), and then to overlap the hand center line 139 with the access straight line 304.

In this embodiment, the first access control has been described as controlling the hand 131 to move in an arc-shaped track (to make swing movement) with a constant relative angle β maintained between the access start position 141 and the intermediate access position 143. It is also possible to change the relative angle β between the access start position 141 and the intermediate access position 143.

In this embodiment, the first access control has been described as controlling the hand 131 to move with a constant angle γ maintained between the access start position 141 and the intermediate access position 143, as well as the relative angle maintained constant. It is also possible to change the relative angle γ between the access start position 141 and the intermediate access position 143.

In this embodiment, the intermediate access position 143 has been described as being at a predetermined position at which the distal end of the hand 131 is adjacent to the entrance prohibited area 305. Another possible example is to set the intermediate access position 143 at a position apart from the entrance prohibited area 305 by a predetermined safety margin. The intermediate access position 143 may be a position at which the distal end of the arm 132 is within the range defined by the circle E even when the hand center line 139 overlaps the access straight line 304, while at the same time the position is outside the entrance prohibited area 305. In view of this, the intermediate access position 143 may not be limited to the illustrated position, but may be set at an optimum position according to the shape of the hand and the shape of the entrance prohibited area 305 in the cassette 30.

In this embodiment, the substrate transfer robot 13 has been described as inclining the hand center line 139 with respect to the access straight line 304 with the substrate holding center 138 being at the access start position 141 only when the hand 131 approaches the cassette 30*b*, which is farther than the cassette 30*a*. It is also possible incline the hand center line 139 with respect to the access straight line 304 with the substrate holding center 138 being at the access start position 141 also when the hand 131 approaches the closer cassette 30*a*.

In this embodiment, when the hand 131 approaches the cassette 30 (30*b*), the first access control is performed to incline the hand center line 139 with respect to the access straight line 304 at the access start position 141. It is also possible to perform the first access control when the hand 131 approaches the processing chamber 203 of the processing apparatus 20. Specifically, the hand center line 139 is inclined with respect to an access straight line to the processing chamber 203 at an access start position to the processing chamber 203. This enables the hand to approach the processing chamber even when the processing chamber is disposed at a distant position.

In this embodiment, the substrate transfer system has been described as transferring the substrate 110 between the cassette 30 and the processing apparatus 20 using the substrate transfer robot 13. Other possible examples of the substrate transfer system include, but are not limited to, a substrate transfer system that transfers a substrate to and from an apparatus or a device other than the processing apparatus in the production process of semiconductor devices. Examples of such an apparatus or a device include, but are not limited to, a temporary substrate stand with a buffer to forward the substrate to the next step. In this case, similarly to the above-described embodiment, it is possible to perform the first access control when the hand approaches the buffer. Specifically, the hand center line may be inclined with respect to the access straight line at the access start position to the buffer. This enables the hand to approach the buffer even when the buffer is disposed at a distant position. In this case, the buffer is an example of the "substrate storage".

In this embodiment, the robot installment area has been described as being disposed between the front wall and the rear wall approximately parallel to each other. The robot installment area may be surrounded by a first wall and a second wall orthogonal to each other.

Obviously, numerous modifications and variations of the present disclosure are possible in light of the above teachings. It is therefore to be understood that within the scope of the appended claims, the present disclosure may be practiced otherwise than as specifically described herein.

What is claimed as new and desired to be secured by Letters Patent of the United States is:

1. A substrate transfer robot comprising:
    a hand configured to approach a substrate storage on which a substrate is placed, and configured to hold the substrate;
    an arm configured to move the hand; and
    a controller configured to control a position and an orientation of the hand such that as viewed in plan view, at an access start position that is a predetermined distance from the substrate storage, a substrate holding center is adjacent to the substrate storage and a hand center line is inclined with respect to an access straight line, as the substrate holding center is moved toward a substrate placement position in the substrate storage the hand center line is rotated so as to overlap the access straight line, the hand center line being oriented from a base of the hand to a distal end of the hand, the access straight line being perpendicular to a front surface of the substrate storage and being associated with the hand approaching the substrate storage,
    wherein the controller is further configured to control the position and orientation of the hand such that the hand is continuously rotated to move the hand from the access start position to an intermediate access position, the intermediate access position being located within an outer edge of the substrate storage.

2. The substrate transfer robot according to claim 1,
    wherein the hand is approachable to a first substrate storage and a second substrate storage farther away from the substrate transfer robot than the first substrate storage is away from the substrate transfer robot,
    wherein the controller is configured to control the hand to approach the first substrate storage while controlling the hand center line to overlap the access straight line with the substrate holding center being at the access start position, and
    wherein the controller is configured to control the hand to approach the second substrate storage while inclining the hand center line with respect to the access straight line within a movable range of the arm with the substrate holding center being at the access start position.

3. The substrate transfer robot according to claim 1,
    wherein the arm is coupled to the hand at a distal end of the arm, and comprises a plurality of arm sections coupled together end-to-end, and
    the controller is configured to move the hand to the intermediate access position from the access start position while maintaining a constant relative angle between at least two contiguous arm sections of the plurality of arm sections.

4. The substrate transfer robot according to claim 1,
    wherein the controller is configured move the hand to the intermediate access position from the access start position by rotating an entirety of the arm along an arc-shaped path.

5. The substrate transfer robot according to claim 1,
    wherein the controller is configured to change an orientation of the hand center line between the access start position and the substrate placement position so as to make the hand center line overlap the access straight line, and configured to control the substrate holding center to reach the substrate placement position with the hand center line overlapping the access straight line.

6. The substrate transfer robot according to claim 5,
    wherein the hand is approachable to a first substrate storage and a second substrate storage farther away from the substrate transfer robot than the first substrate storage is away from the substrate transfer robot,
    wherein the controller is configured to control the hand to approach the first substrate storage while controlling the hand center line to overlap the access straight line with the substrate holding center being at the access start position, and
    wherein the controller is configured to control the hand to approach the second substrate storage while inclining the hand center line with respect to the access straight line within a movable range of the arm with the substrate holding center being at the access start position.

7. The substrate transfer robot according to claim 5,
    wherein the controller is configured to make the hand center line overlap the access straight line with the substrate holding center positioned at the intermediate access position, the intermediate access position being further toward the substrate storage beyond the access start position, and
    wherein between the intermediate access position and the substrate placement position, the controller is configured to control the hand to make linear movement with the hand center line overlapping the access straight line.

8. The substrate transfer robot according to claim 7,
    wherein the arm is coupled to the hand at a distal end of the arm, and comprises a plurality of arm sections coupled together end-to-end from a swing center of the arm to the distal end of the arm, the plurality of arm sections being turnable at ends of the plurality of arm sections, and
    wherein from a state in which in plan view the substrate holding center of the hand is at the access start position and the hand center line is inclined with respect to the access straight line, the controller is configured to move the hand to the intermediate access position with a constant relative angle maintained between at least two arm sections next to each other among the plurality of arm sections.

9. The substrate transfer robot according to claim 7,
    wherein the hand is approachable to a first substrate storage and a second substrate storage farther away from the substrate transfer robot than the first substrate storage is away from the substrate transfer robot,
    wherein the controller is configured to control the hand to approach the first substrate storage while controlling the hand center line to overlap the access straight line with the substrate holding center being at the access start position, and
    wherein the controller is configured to control the hand to approach the second substrate storage while inclining the hand center line with respect to the access straight line within a movable range of the arm with the substrate holding center being at the access start position.

10. The substrate transfer robot according to claim 7,
wherein the substrate storage comprises a cassette,
wherein the access start position comprises a position at which the substrate holding center at the time when the hand is holding the substrate adjacent to the outer edge, which is an outer edge of a cassette opening/closing area, and
wherein the intermediate access position comprises a position that is further toward the cassette beyond the outer edge of the cassette opening/closing area and that is outside an entrance prohibited area for the hand in the cassette.

11. The substrate transfer robot according to claim 10,
wherein the arm is coupled to the hand at a distal end of the arm, and comprises a plurality of arm sections coupled together end-to-end from a swing center of the arm to the distal end of the arm, the plurality of arm sections being turnable at ends of the plurality of arm sections, and
wherein from a state in which in plan view the substrate holding center of the hand is at the access start position and the hand center line is inclined with respect to the access straight line, the controller is configured to move the hand to the intermediate access position with a constant relative angle maintained between at least two arm sections next to each other among the plurality of arm sections.

12. A substrate transfer robot comprising:
a hand configured to approach a substrate storage on which a substrate is placed, and configured to hold the substrate;
an arm configured to move the hand; and
a controller configured to control a position and an orientation of the hand such that as viewed in plan view, at an access start position that is a predetermined distance from the substrate storage, a substrate holding center is adjacent to the substrate storage and a hand center line is inclined with respect to an access straight line, as the substrate holding center is moved toward a substrate placement position in the substrate storage the hand center line is rotated so as to overlap the access straight line, the hand center line being oriented from a base of the hand to a distal end of the hand, the access straight line being perpendicular to a front surface of the substrate storage and being associated with the hand approaching the substrate storage,
wherein the controller is configured to change an orientation of the hand center line between the access start position and the substrate placement position so as to make the hand center line overlap the access straight line, and configured to control the substrate holding center to reach the substrate placement position with the hand center line overlapping the access straight line,
wherein the controller is configured to make the hand center line overlap the access straight line with the substrate holding center positioned at an intermediate access position, the intermediate access position being further toward the substrate storage beyond the access start position,
wherein between the intermediate access position and the substrate placement position, the controller is configured to control the hand to make linear movement with the hand center line overlapping the access straight line,
wherein the arm is coupled to the hand at a distal end of the arm, and comprises a plurality of arm sections coupled together end-to-end from a swing center of the arm to the distal end of the arm, the plurality of arm sections being turnable at ends of the plurality of arm sections,
wherein a first distance is defined between the distal end of the arm and the swing center of the arm at a time when the substrate holding center is at the intermediate access position, and a second distance is defined between the distal end of the arm and the swing center of the arm at a time when the substrate holding center is at the substrate placement position, and
wherein a longer distance among the first distance and the second distance is equal to or less than a sum of all link lengths of the plurality of arm sections and equal to or less than a reachable length of the arm.

13. The substrate transfer robot according to claim 12,
wherein the arm is coupled to the hand at a distal end of the arm, and comprises a plurality of arm sections coupled together end-to-end from a swing center of the arm to the distal end of the arm, the plurality of arm sections being turnable at ends of the plurality of arm sections, and
wherein from a state in which in plan view the substrate holding center of the hand is at the access start position and the hand center line is inclined with respect to the access straight line, the controller is configured to move the hand to the intermediate access position with a constant relative angle maintained between at least two arm sections next to each other among the plurality of arm sections.

14. The substrate transfer robot according to claim 12,
wherein the substrate storage comprises a cassette,
wherein the access start position comprises a position at which the substrate holding center at the time when the hand is holding the substrate adjacent to an outer edge of a cassette opening/closing area, and
wherein the intermediate access position comprises a position that is further toward the cassette beyond the outer edge of the cassette opening/closing area and that is outside an entrance prohibited area for the hand in the cassette.

15. The substrate transfer robot according to claim 14,
wherein the arm is coupled to the hand at a distal end of the arm, and comprises a plurality of arm sections coupled together end-to-end from a swing center of the arm to the distal end of the arm, the plurality of arm sections being turnable at ends of the plurality of arm sections, and
wherein from a state in which in plan view the substrate holding center of the hand is at the access start position and the hand center line is inclined with respect to the access straight line, the controller is configured to move the hand to the intermediate access position with a constant relative angle maintained between at least two arm sections next to each other among the plurality of arm sections.

16. The substrate transfer robot according to claim 14, wherein the intermediate access position comprises a predetermined position which is determined according to a shape of the hand and a shape of the entrance prohibited area in the cassette and at which the distal end of the hand is adjacent to the entrance prohibited area.

17. The substrate transfer robot according to claim 16,
wherein the arm is coupled to the hand at a distal end of the arm, and comprises a plurality of arm sections coupled together end-to-end from a swing center of the arm to the distal end of the arm, the plurality of arm sections being turnable at ends of the plurality of arm sections, and wherein from a state in which in plan view the substrate holding center of the hand is at the access start position and the hand center line is inclined with respect to the access straight line, the controller is configured to move the hand to the intermediate access position with a constant relative angle maintained between at least two arm sections next to each other among the plurality of arm sections.

18. A substrate transfer robot comprising:

a hand configured to approach a substrate storage on which a substrate is placed, and configured to hold the substrate;

an arm configured to move the hand; and a controller configured to control a position and an orientation of the hand such that as viewed in plan view, at an access start position that is a predetermined distance from the substrate storage, a substrate holding center is adjacent to the substrate storage and a hand center line is inclined with respect to an access straight line, as the substrate holding center is moved toward a substrate placement position in the substrate storage the hand center line is rotated so as to overlap the access straight line, the hand center line being oriented from a base of the hand to a distal end of the hand, the access straight line being perpendicular to a front surface of the substrate storage and being associated with the hand approaching the substrate storage, wherein the controller is configured to change an orientation of the hand center line between the access start position and the substrate placement position so as to make the hand center line overlap the access straight line, and configured to control the substrate holding center to reach the substrate placement position with the hand center line overlapping the access straight line, wherein the controller is configured to make the hand center line overlap the access straight line with the substrate holding center positioned at an intermediate access position, the intermediate access position being further toward the substrate storage beyond the access start position, wherein between the intermediate access position and the substrate placement position, the controller is configured to control the hand to make linear movement with the hand center line overlapping the access straight line, wherein the substrate storage comprises a cassette, wherein the access start position comprises a position at which the substrate holding center at the time when the hand is holding the substrate adjacent to an outer edge of a cassette opening/closing area, wherein the intermediate access position comprises a position that is further toward the cassette beyond the outer edge of the cassette opening/closing area and that is outside an entrance prohibited area for the hand in the cassette, and wherein the intermediate access position comprises a predetermined position which is determined according to a shape of the hand and a shape of the entrance prohibited area in the cassette and at which the distal end of the hand is adjacent to the entrance prohibited area.

19. The substrate transfer robot according to claim 18, wherein the arm is coupled to the hand at a distal end of the arm, and comprises a plurality of arm sections coupled together end-to-end from a swing center of the arm to the distal end of the arm, the plurality of arm sections being turnable at ends of the plurality of arm sections, and wherein from a state in which in plan view the substrate holding center of the hand is at the access start position and the hand center line is inclined with respect to the access straight line, the controller is configured to move the hand to the intermediate access position with a constant relative angle maintained between at least two arm sections next to each other among the plurality of arm sections.

20. A substrate transfer system comprising:

a robot installment area; and a substrate transfer robot in the robot installment area, the substrate transfer robot comprising:

a hand configured to approach a substrate storage on which a substrate is placed, and configured to hold the substrate; and an arm configured to move the hand, the substrate transfer robot being configured to move the hand such that as viewed in plan view, at an access start position that is a predetermined distance from the substrate storage, a substrate holding center is adjacent to the substrate storage and a hand center line is inclined with respect to an access straight line, as the substrate holding center is moved toward a substrate placement position in the substrate storage the hand center line is rotated so as to overlap the access straight line, the hand center line being oriented from a base of the hand to a distal end of the hand, the access straight line being perpendicular to a front surface of the substrate storage and being associated with the hand approaching the substrate storage, wherein the substrate transfer robot is further configured to move the hand such that the hand is continuously rotated to move the hand from the access start position to an intermediate access position, the intermediate access position being located within an outer edge of the substrate storage.

21. A method for transferring a substrate using a hand of a substrate transfer robot approaching a substrate storage on which the substrate is placed, the method comprising:

positioning a hand center line at an incline with respect to an access straight line as viewed in plan view such that, at an access start position that is a predetermined distance from the substrate storage, a substrate holding center is adjacent to the substrate storage and the hand center line is inclined with respect to an access straight line, the hand center line being oriented from a base of the hand to a distal end of the hand, the access straight line being perpendicular to a front surface of the substrate storage and being associated with the hand approaching the substrate storage; and changing an orientation of the hand center line between the access start position and a substrate placement position in the substrate storage so as to make the hand center line overlap the access straight line, and controlling the substrate holding center to reach the substrate placement position with the hand center line overlapping the access straight line, wherein changing the orientation of the hand center line includes continuously rotating the hand from the access start position to an intermediate access position located within an outer edge of the substrate storage.

22. A substrate transfer robot comprising:
a hand; and
an arm coupled to the hand at a distal end of the arm,
wherein at an access start position, a position and an orientation of the hand at a time when the hand is approaching a substrate storage on which the substrate is placed are such that the hand is inclined with respect to an access straight line that is perpendicular to a front surface of the substrate storage,
wherein at an intermediate access position within an outer edge of the substrate storage, the position and orientation of the arm are located such that the hand is continuously rotated from the access start position to the intermediate access position, and
wherein at a substrate placement position in the substrate storage, the position and the orientation of the hand at the time when the hand is approaching the substrate storage are set along the access straight line.

* * * * *